United States Patent [19]

Punchard et al.

[11] Patent Number: 4,733,189
[45] Date of Patent: Mar. 22, 1988

[54] MAGNETIC RESONANCE IMAGING SYSTEMS

[75] Inventors: William F. B. Punchard, Sudbury; Robert D. Pillsbury, Newton, both of Mass.

[73] Assignee: Massachusetts Institute of Technology, Cambridge, Mass.

[21] Appl. No.: 870,031

[22] Filed: Jun. 3, 1986

[51] Int. Cl.$^4$ ............................................. G01R 33/20
[52] U.S. Cl. ...................................... 324/318; 324/320
[58] Field of Search ............... 324/318, 319, 322, 320, 324/309, 222, 127 (U.S. only); 336/84 R, 84 C; 128/653; 310/52

[56] References Cited

U.S. PATENT DOCUMENTS

| | | | |
|---|---|---|---|
| 4,275,323 | 6/1981 | Hatch | 310/52 |
| 4,449,097 | 5/1984 | Young et al. | 324/309 |
| 4,486,711 | 12/1984 | Frese et al. | 324/319 |
| 4,585,995 | 4/1986 | Flugan | 324/322 |

FOREIGN PATENT DOCUMENTS

| | | |
|---|---|---|
| 132338 | 7/1984 | European Pat. Off. . |
| 122592 | 10/1984 | European Pat. Off. . |
| 134701 | 3/1985 | European Pat. Off. . |
| 3301630 | 7/1984 | Fed. Rep. of Germany . |

OTHER PUBLICATIONS

Bradley et al., "Physical Principles of Nuclear Magnetic Resonance", vol. 2, *Modern Neuroradiology: Advance Imaging Techniques*, pp. 15–61, (Newton & Potts, Ed., Clavadel Press, San Anselmo, California 1983).

Primary Examiner—Michael J. Tokar
Assistant Examiner—Louis M. Arana
Attorney, Agent, or Firm—James E. Maslow; Thomas J. Engellenner

[57] ABSTRACT

Novel apparatus and methods for magnetic resonance imaging are disclosed which improve imaging speed and resolution as well as increase efficiency, particularly in superconducting systems. In one aspect of the invention, it has been discovered that the eddy currents and harmonics which normally interfere with MRI operations can be suppressed by the construction of an active shield about the gradient-forming components of the system. The active shield, for example, can be implemented by another set of coils, placed between the gradient coils and the cryostat in a superconducting MRI system to zero particular harmonics and prevent eddy currents in the cryostat shells. By employing a set of active secondary coils the problems associated with eddy currents induced by the gradient producing coils are substantially controlled.

17 Claims, 9 Drawing Figures

MAGNETIC RESONANCE IMAGING SYSTEMS

BACKGROUND OF THE INVENTION

The technical field of this invention is magnetic resonance imaging (hereinafter referred to as "MRI") and, in particular, MRI systems which employ pulsed gradient coils to provide magnetic field gradients.

MRI systems measure the density distribution or relaxation time distribution of nuclear spins in objects, which can be inanimate or living. Because MRI systems offer the potential for images without the invasiveness of surgery or X-ray photography, MRI holds great promise for advances in medical research and diagnosis.

Magnetic resonance imaging ("MRI") is based on the phenomenon of nuclear magnetic resonance ("NMR"). When an object is placed in a magnetic field, the field causes the spin vectors of certain types of nuclei (e.g. $^1H$, $^{13}C$, $^{31}P$ and $^{23}Na$) to orient themselves with respect to the field. The nuclear vectors, when supplied with the right amount of energy, will reorient themselves in the field and emit or absorb energy in the process. The energy needed to perturb the nuclear spin vectors is in the radio frequency range, and the specific frequency depends on the strength of the magnetic field experienced by the nuclei. In NMR analysis, the sample is placed in a large, uniform, static magnetic field. The sample is perturbed by a pulse of radio frequency energy, and the frequency response to this perturbation is recorded. A measure of intensity as a function of resonance frequency or magnetic field at the nucleus is obtained.

Imaging techniques carry the analysis one step further by using magnetic field gradients in addition to the base uniform magnetic field. Since the resonance frequency of the nuclei depends on the magnetic field strength, field gradients provide spatial encoding. MRI devices correlate signal intensity at a given frequency with sample concentration at a given location. This provides a map or image of the object which is based on intensity variation due to concentration or relaxation time differences. The essential field gradients are produced with a set of gradient coils. These coils are often referred to as "pulsed gradient coils" because they are energized by pulses which grade the background field in two or more orthogonal directions.

Imaging the entire body of a patient typically requires a steady, high homogeneity, background field of at least 0.5 tesla and highly linear gradients in the range of 1 gauss/cm with rise and fall times as short as possible, typically on the order of a few milliseconds. An axial gradient (i.e. in the "Z" direction) is typically produced by solenoid coils while radial gradients (which define "X" and "Y" coordinates) are formed by saddle-shaped coils. For a further discussion of MRI systems, see Bradley et al., "Physical Principles of Nuclear Magnetic Resonance" in *Vol. 2 Modern Neuroradiology: Advanced Imaging Techniques.* pp 15-61 (Newton and Potts, Eds. 1983) herein incorporated by reference.

Regardless of the way in which the background field is produced, be it by conventional resistive, permanent or superconducting magnet systems, the changing magnetic fields from the pulsed gradient coils will induce eddy currents in any nearby conducting media. These eddy currents have an adverse effect on both the spatial and temporal quality of the desired gradient fields. That is, the eddy currents will perturb the field from the desired level and quality in both space and time. In order to minimize the effects of these eddy currents, the gradient coils must be operated at an increased power level (i.e. overdriven in order to attain the desired field level in the desired time) or a longer rise time must be used to reduce the magnitude and effect of the eddy currents (thereby increasing the total scan time). However, the harmonic content of the gradient field will still change as the eddy currents decay (i.e. the gradient linearity will change during the pulse).

Furthermore, if the system generating the background field is superconducting, additional undesirable effects occur. In such a system, surrounding conducting media include cryogenic components (e.g. the radiation shield and liquid helium vessel), and Joule heating due to the induced eddy currents will cause an increased boil-off of cryogens. A more subtle effect can also occur as a result of the properties of the superconducting materials from which the conductor is fabricated. Such materials, when exposed to time varying magnetic fields exhibit electrically resistive behavior. This manifests itself as a decay in current in the superconducting coil or coils. A decay in the current of the background field coil degrades the temporal quality of the background field; while a current decay in the superconducting shim coils degrades the field uniformity.

Even in MRI systems that use resistive or permanent magnets to establish the background field, the gradient coils will induce eddy currents in nearby conducting media that will adversely affect the temporal and spatial field quality.

Existing solutions to the eddy current problem are less than satisfactory. Use of non-conductive bore tubes reduces the magnitude of the perturbations of the pulsed gradient field but creates greater cryogen boiloff and greater interaction of the pulsed gradient field with the background field coil systems. Heavy passive shields (typically thick-walled, copper cylinders) placed between the room temperature bore tube and the liquid helium vessel protect the superconducting system but result in additional heat loads at an intermediate temperature (e.g. liquid nitrogen temperature) as well as behavior which is unpredictable and dependent on pulse sequence. Overdriving the pulsed gradient system can produce the desired rate of rise of pulsed gradient field but does not resolve the problem of the spatial and temporal quality of this field, and the amount of "overdrive" necessary again is dependent on the pulse sequence employed.

There exists a need for more efficient, higher resolution, MRI systems. Magnetic resonance imaging devices which are capable of suppressing eddy currents and/or improving the quality of the field in both space and time would satisfy substantial needs in the art.

SUMMARY OF THE INVENTION

Novel systems and methods for magnetic resonance imaging are disclosed in which an active shield is constructed to suppress eddy currents which would otherwise interfere with the magnetic resonance operations.

Problems caused by eddy currents induced by pulsed gradient coils, namely (a) temporal and spatial degradation of the quality of the pulsed gradient field, (b) temporal and spatial degradation of the quality of the background field, and (c) Joule heating in cyrogenic components are addressed by the disclosed system. The invention employs an active shield which includes pulsed secondary coils which isolate the main magnet and associated components (e.g., the cryostat and its contents in a superconducting system) from the changing magnetic fields of the pulsed gradient coils.

In one preferred embodiment, three pulsed gradient coils (defining the X, Y, and Z axes, respectively) are isolated from the cryostat and main magnet by a secondary set of three corresponding shield components that are driven by currents opposite to the gradient coils. The distribution of the shield windings and the magnitude of the currents in them are adjusted to produce a magnetic field outside the shield equal to but opposite in sign from the field produced by the pulsed gradient coils. Therefore, the sum of the fields from a pulsed gradient coil and its active shield is zero outside the pair. Since eddy currents are induced by a changing magnetic field, if the field magnitude is zero at all times, no eddy currents are induced. At the same time, the placement of the gradient and shield windings can be made so as to reduce or zero unwanted pulsed gradient coil field harmonics.

For the case of the solenoidal Z pulsed gradient coil set and saddle-shaped X and Y pulsed gradient coil sets, particular active shield configurations are disclosed.

By eliminating induced eddy currents the invention improves the resolution of images and reduces imaging time. It is particularly suited to superconducting systems where the reduced resistivities of components operating at low temperatures result in higher induced currents. Furthermore, in superconducting systems, the elimination of interaction between the pulsed gradient coils and cryogenic components improves the spatial and temporal quality of the background field and reduces cryogen boil off.

DETAILED DESCRIPTION

Figure 1:
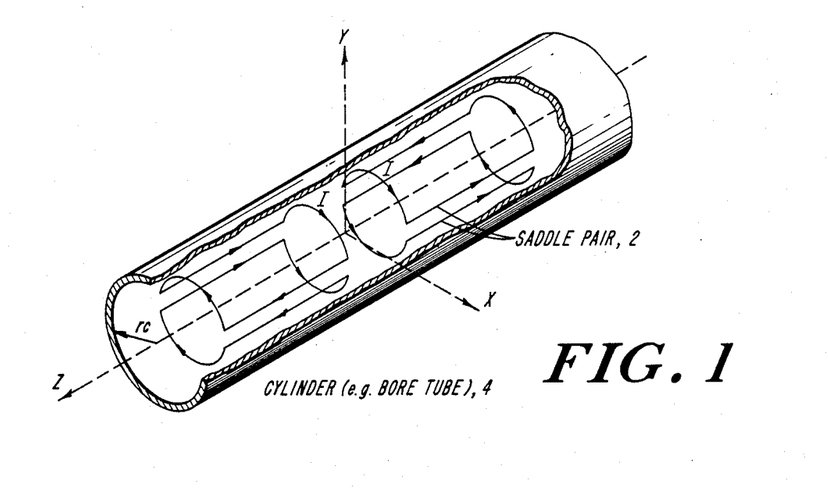
FIG. 1 is a schematic illustration of a typical radial gradient system for magnetic resonance imaging.

FIG. 1 shows a typical arrangement of four saddle shaped coils 2 which produce a gradient $dB_z/dy$ at the origin of a typical MRI system. Also shown is a typical cylindrical shell 4 surrounding the coils 2. The saddle coils are pulsed to produce the Y gradient. If the cylinder is assumed to have an infinite electrical conductivity, then when the gradient coil is pulsed, the eddy currents induced will follow the gradient coil pulse shape. In addition, they will not decay with time or diffuse into the shell. Also the field outside of the cylinder will be zero for all times. The eddy current pattern in the shell can be found using conventional magnetic field calculation techniques.

Once the eddy current pattern is found, it can be simulated by a distribution of current carrying windings. The result is an active shield which along with the gradient coil produces the desired gradient field at the origin and a zero field outside of the shield windings. Since the field is zero, there are no eddy currents induced in conducting media outside the shield.

Figure 2A:
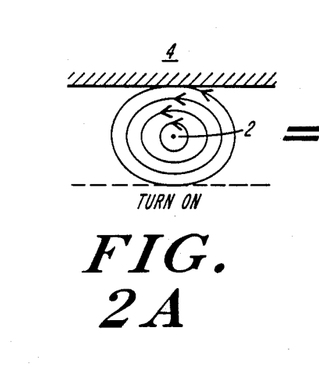
FIGS. 2A–2C is an illustration of the eddy current cancellation problem addressed herein.
Figure 2B:
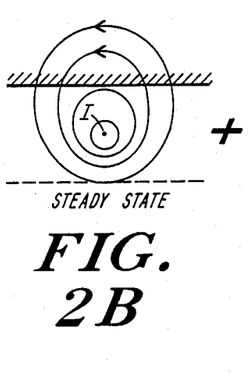
Figure 2C:
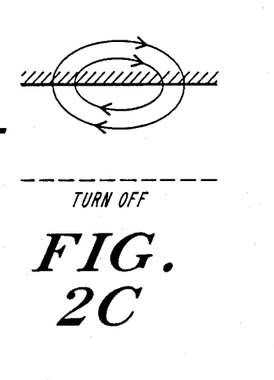

The eddy current problem is illustrated in FIG. 2 for a solenoidal system. FIG. 2A shows the magnetic field lines that result when a turn 2 inside an infinitely conductive cylinder 4 is pulsed. Note that the field lines are constrained to be entirely within the cylinder. This field pattern can be decomposed into a field pattern due to the gradient coil with no cylinder present, FIG. 2B and a field pattern produced by the current distribution in the cylinder, FIG. 2C. The field pattern in FIG. 2A is the same whether the field pattern in FIG. 2C is produced by eddy currents in an infinitely conducting shell or by a current through turns of a distributed winding. Therefore, once the distribution of eddy currents in an infinitely conducting shell have been determined with three dimensional magnetic field calculation techniques, they can be replaced by a distribution of turns of an active winding which will produce the same field pattern.

A single gradient coil turn and shield winding will produce a zero field outside the shield, but may not produce the desired gradient field quality about the origin of the system. However, in the absence of ferromagnetic material inside the shield windings, the linearity of the field equations allows the superposition of several gradient coil turns (or a distribution of turns of a single coil) and concomitant shield winding distributions. Each gradient coil turn and shield produce zero net field outside the shield; therefore, the sum of several gradient coil turns and shield windings will also produce zero field outside. In addition, each set of gradient coil turn and shield will produce a certain field gradient and other field derivatives (or harmonics) at the system origin. The gradient coil turns may be placed in such a manner that they and the shield windings produce the desired gradient field magnitude and quality (and at the same time produce zero field outside of the shield). A key feature of this method is that the shield winding distribution need only be calculated once for a single gradient coil turn for a particular radius. Then the effect of a distribution of gradient coil turns, (constituting a gradient coil) can be found by superposition and does not require the recalculation of the shield winding distribution.

Figure 3:
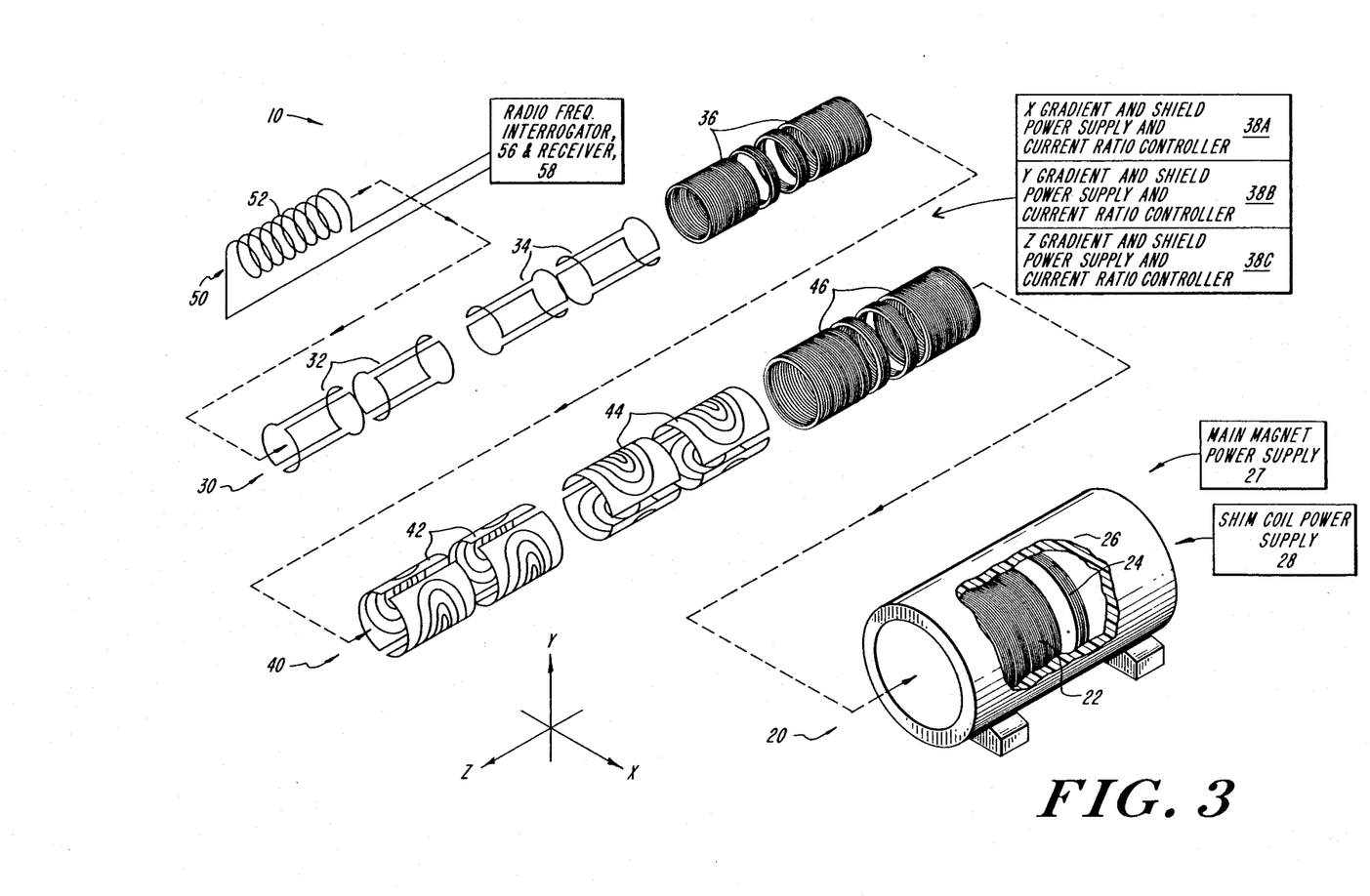
FIG. 3 is schematic overview of a magnetic resonance imaging system employing the active shield elements of the present invention.

The methods described above can be implemented, for example, as shown in FIG. 3 by a magnetic resonance imaging system 10 having a main magnet component 20, a pulsed gradient component 30, an active shield component 40 and a detection component 50. FIG. 3 is an exploded view of the concentric elements of a MRI system according to the invention.

The main magnet component 20 can be a permanent magnet, a resistive electromagnet, or a superconducting system as shown in which a solenoidal electromagnet 22 is encased within a cyrogenic vessel 26 and driven by a power supply 27. Shim coils 24 (room temperature or superconducting as shown) can also be employed and driven by a shim coil driver 28 in order to zero harmonics and improve the uniformity of the static main magnet field.

Various techniques can be employed to implement the main magnet component 20 of the present invention. For examples, see Partain, *Nuclear Magnetic Resonance Imaging* (1983); *Nuclear Magnetic Resonance Imaging in Medicine* (Kaufman Ed. 1981); Morris, *Nuclear Magnetic Resonance Imaging in Medicine and Biology* (1986); U.S. Pat. No. 4,307,343 issued to Likes on Dec. 22, 1981; and U.S. Pat. No. 4,449,097 issued to Young et al. on May 15, 1984. These publications are incorporated herein by reference.

The system 10 of FIG. 3 also includes a pulsed gradient component 30 having an X-gradient element 32, a Y-gradient element 34 and a Z-gradient element 36, disposed to create gradient fields orthogonal to each other when excited by power supplies 38A, 38B, and 38C. The X and Y gradient-producing elements are preferably implemented by saddle-shaped coil elements disposed about the main magnetic field axis and rotated ninety degrees from each other in orientation. The Z-gradient element is preferably implemented by a solenoidal element coaxial with the main magnetic field axis. Also shown in FIG. 3 is a detection component 50 with a radio frequency (RF) coil 52 and an RF interrogator 56 and receiver 58. The interrogator 56 produces a pulse of radio frequency excitation and the energy emitted as the atoms return to an aligned state is captured via coil 52 and used to obtain an image signal. In use, a patient or other object is positioned within the central bore of the system 10.

Various interrogation and image-formation methods can be employed in connection with the detection component 50. For example, such methods are described in "Image Formation by Nuclear Magnetic Resonance: The Sensitive-Point Method" by W. Hinshaw in Vol. 47, No. 8, *Journal of Applied Physics* pp. 3709–3721 (1975) and also in "Biological and Medical Imaging by NMR" by P. Mansfield and I. L. Pykett in Vol. 29, *Journal of Magnetic Resonance* pp. 355–373 (1978). Others achieve this pixel identification by two dimensional Fourier transform methods, such as Fourier zeugmatography, or spin warp imaging. See, "NMR Fourier Zeugmatography" by Kumar, Webti, and Ernst in Vol. 18, *Journal of Magnetic Resonance* pp. 69–83 (1985) and "Sensitivity and Performance Time in NMR Imaging" by P. Burner and R. R. Ernst in Vol. 33, *Journal of Magnetic Resonance* pp. 83–106 (1979). Finally, in another method of pixel identification, the images are reconstructed by coherently adding the signal generated in many one-dimensional projections. Such a method is described in "Image Formation By Induced Local Interactions: Examples Employing Nuclear Magnetic Resonance" by P. C. Lauterbur in Vol. 242, No. 5394, *Nature* pp. 190–191 (1973). The disclosures of these publications are incorporated by reference.

The system of FIG. 3 further includes an active shield component 40 having an X-shield element 42, a Y-shield element 44, and a Z-shield element 46 disposed to counteract the eddy currents induced by the gradient-producing elements 32, 34 and 36, respectively. The X and Y shield elements, 42 and 44 can be implemented by saddle-shaped coils cut from flat copper sheets and rolled into the appropriate saddle shapes. For particular X and Y gradient-producing coil configurations, the optimal shield configurations are determined by magnetic field calculations as discussed further below. The Z shield element 46 can be implemented by a multiple-strand cable solenoidal coil and the configurations for particular Z gradients are again determined by three dimensional magnetic field calculation. In the illustrated embodiment, the same power supplies 38A, 38B and 38C which pulse the corresponding X, Y and Z gradient producing coils, provide current pulses to the shield elements.

Figure 4:
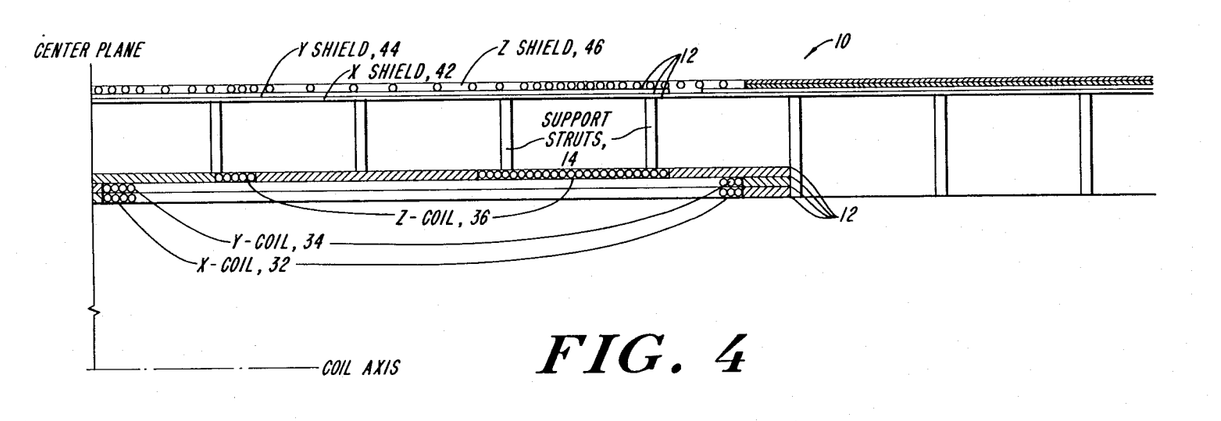
FIG. 4 is a partial cross-sectional view of a magnetic resonance imaging system showing the gradient coils and the active shield elements of the present invention.

FIG. 4 is a partial cross-section of the system of FIG. 3 showing the X, Y, and Z gradient coils and the X, Y, and Z shield coils. Concentric fiberglass shells 12 isolate the various coils from each other. Support struts 14 provide radial rigidity to the structure. The X, Y and Z gradient coils are wound about their shells in conventional manner. Exemplary gradient coil construction techniques and geometries can be found in U.S. Pat. No. 3,569,823 issued to Golay in March 1971 and U.S. Pat. No. 4,486,711 issued to Frese et al. on Dec. 4, 1984, both of which are incorporated herein by reference.

Figure 5:
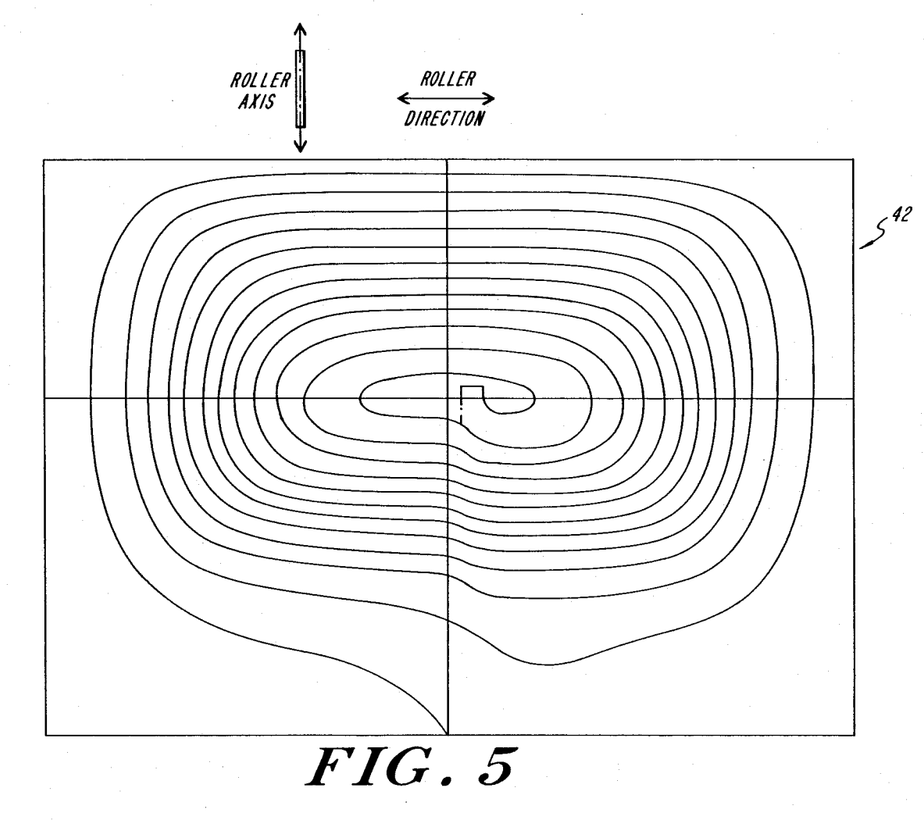
FIG. 5 is a more detailed schematic illustration of an active shield element for use with a saddle-shaped X or Y gradient coil.

FIG. 5 is a planar illustration of a X-shield element 42 cut from a metallic conductive sheet material. Four such elements are arranged in a symmetric configuration about the main magnetic axis to form the X-shield. A similar set of four conductive sheets (of slightly larger area to accommodate the larger radius of curvature) are employed to form a Y-shield. Each of the shield elements 42, 44 is cut in the appropriate places, rolled into a saddle shape and mounted on the system to isolate the respective gradient coil from the main magnet, cryostat, shim coils and associated components.

Figure 6:
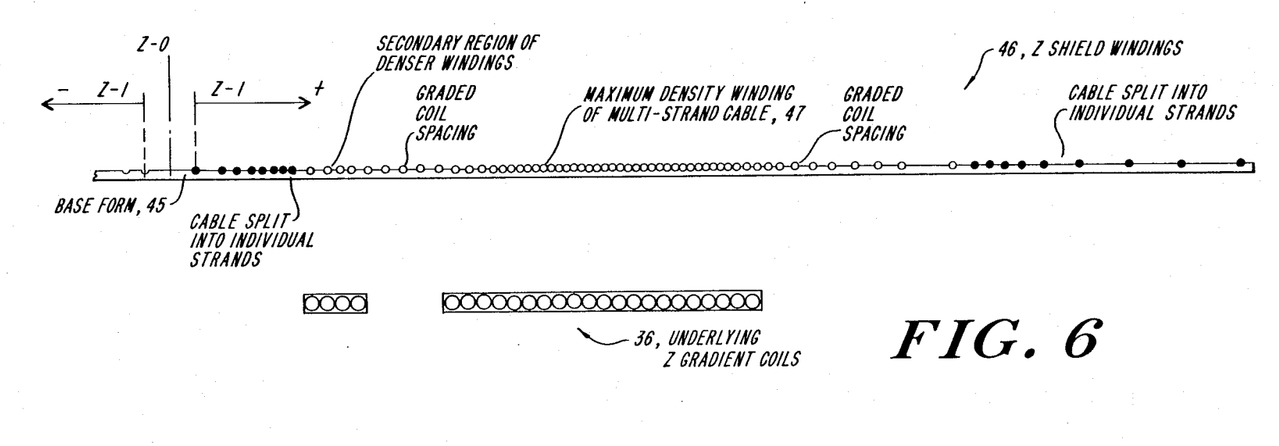
FIG. 6 is a more detailed schematic illustration of an active shield element for use with a solenoidal Z gradient coil.

FIG. 6 is a partial cross-sectional illustration of one of two anti-symmetrical Z-shield elements 46 and the base form 45 upon which it is wound. In the illustrated embodiment, each element of the Z-shield is constructed by winding a multi-strand conductive cable 47 about form 45. The placement of the gradient coil turns and the spacing or distribution of the turns in the shield coil are determined by the combined requirements to produce no field external to the shield and to produce the required level and homogeneity of the gradient field over the desired volume. As shown, the Z-shield elements each encompass a region of maximum solenoidal winding density which is progressively graded into less dense regions. At the center and the outer edges of the cylindrical Z-shield, the density of the turns is further reduced by dividing the multi-strand cable into individual strands.

In use, the system 10 described above operates to generate picture elements (pixels); the numerical value of each pixel in the image reflects the intensity of the NMR signal coming from a given volume element of tissue. The main magnet and shim coils establish a uniform background field while the three orthogonal gradient coils are driven by a power supply to provide gradients (e.g. a variation from −15 Gauss to +15 Gauss over a 30 centimeter region. In one embodiment, three independent power supplies can be used to drive the X, Y and Z coils. Each power supply has two channels, one of which is used to drive the gradient coil while the other is used to drive the corresponding active shield element with a current of opposite direction (i.e. 180 degrees out of phase if alternating currents are employed).

Conventional magnetic field calculation techniques performed on a single turn, together with appropriate superpositions to obtain the effect of several turns, allow calculation of shield winding current distributions to any desired degree of precision. However, this continuously varying current distribution is preferably translated into a discrete distribution consisting of a finite number of shield turns. In principle the number of shield turns can be made large enough to match the precision of the field calculation technique initially employed. However, practical considerations, (including, among other things, impedance matching to power supplies, available conductors and winding practicalities), limit the number of turns that can be employed. This, together with manufacturing tolerances, results in a final shield winding pattern which may deviate from the ideal theoretical distribution. Since this winding pattern can be different from the ideal, the ratio of shield operating current to gradient coil operating current may be different from that originally calculated. It is therefore desirable to have a means of adjusting this current ratio to partially compensate for differences between the designed and manufactured shielded gradient coil systems.

Adjustable power supply current ratio controls have been found useful in selecting the optimal current ratios. For each gradient coil/shield coil combination an appropriately configured pickup coil is wound and mounted outside the active shield. In three separate tuning procedures the appropriate pickup coil is used to sense the residual external field as the current ratio in the associated power supply is varied. When the voltage across the pickup coil is minimized the optimal ratio is set.

Figure 7:
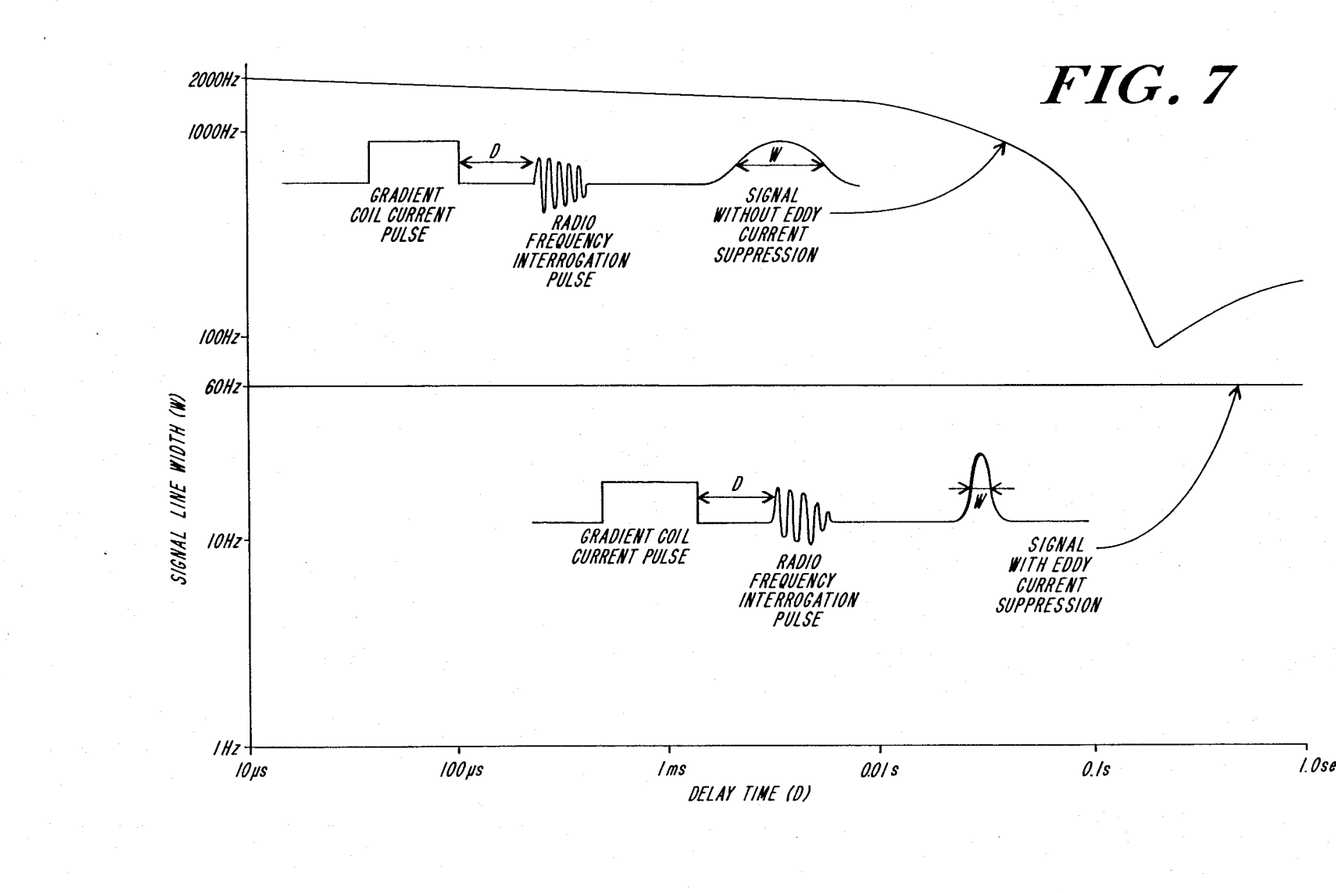
FIG. 7 is a graph of signal line width versus delay time for an MRI system according to the invention, showing the effects of eddy current suppression.

In FIG. 7 experimental results of eddy current suppression are presented. The figure is a log-log scale graph of signal line width (W) versus delay time (D) for an MRI system according to the invention, showing the effects of eddy current suppression by an active shield element as described herein. The data shown in FIG. 7 were obtained by measuring the line widths of signals sensed by an antennae coil after RF interrogation in the MRI system described above. Prior to each interrogation, the axial gradient coils were pulsed and measurements were taken with and without energizing the corresponding active shield element. The delay time between the gradient coil pulse and the interrogation pulse (D) was varied from about 1 second to about 10 microseconds to obtain the data for the graph.

As evident from the graph, driving the active shield element in conjunction with the gradient coils, resulted in a substantially sharper signal, particularly when very short (i.e. less than 1 millisecond) time delays were executed. Comparable data were obtained for the other gradient coils as well when they were used in conjunction with their shield elements. The results were obtained both with short gradient coil pulses (i.e. 40 milliseconds) and longer gradient coil pulses (i.e. 1000 milliseconds).

The invention has been described in connection with certain illustrated embodiments. However, it should be clear that various changes, additions and subtractions can be made by those skilled in the art without departing from the spirit or scope of the invention. For example, the various methods of construction and materials described below can be modified to suit particular applications. Although the shield elements shown in the figures as counteracting the X and Y saddle-shaped gradient coils are described as being formed from flat copper plate spirals, these structures can be replaced by conventional cable or wire shield elements. The order of the concentric gradient and shield elements (i.e. X,Y,Z, gradient; X,Y,Z, shield) can also be varied. Moreover, in some instances it may be preferable to replace two or more of the concentric shells by a single shell.

We claim:

1. A magnetic resonance imaging system for forming an image of an object, the system comprising
   a main magnet for developing a main magnetic field about the object;
   gradient means for producing a gradient magnetic field defining spatial regions within the main magnetic field;
   interrogation means for exciting the nuclei of the object with an interrogation waveform;
   detection means for detecting energy emitted from nuclei of the object within the main magnetic field following excitation by the interrogation means; and
   an active shield means disposed between the main magnet and the gradient means for shielding the main magnet from currents induced by excitation of the gradient means.

2. The system of claim 1 wherein the main magnet is a permanent magnet.

3. The system of claim 1 wherein the main magnet is a resistive electromagnet.

4. The system of claim 1 wherein the main magnet is a superconducting electromagnet.

5. The system of claim 1 wherein the main magnet further includes at least one shim coil, which shim coil is electrically driven to reduce non-uniformities in the main magnetic field.

6. The system of claim 1 wherein the gradient means further comprises a plurality of electromagnetic elements which grade the main magnetic field in at least two orthogonal directions.

7. The system of claim 6 wherein at least three electromagnetic elements are employed to spatially grade the main magnet field in three dimensions.

8. The system of claim 7 wherein the electromagnetic elements further include at least one solenoidal coil aligned with the main magnetic field and at least two sets of saddle-shaped coils disposed orthogonally to each other and the solenoidal coil.

9. The system of claim 1 wherein the object is a patient.

10. The system of claim 6 wherein the active shield means further includes means responsive to currents induced by the electromagnetic elements.

11. The system of claim 10 wherein the active shield means comprises a plurality of electromagnetic shield elements carrying currents in opposite directions to the currents carried by the gradient-producing electromagnetic elements.

12. The system of claim 11 wherein each gradient-producing electromagnetic element and its corresponding active shield element are connected to a single power supply.

13. The system of claim 12 wherein the gradient-producing element and the corresponding active shield are driven by an alternating current, 180 degrees out of phase from each other.

14. The system of claim 13 wherein the system further comprises an adjustable controller for selecting an optimal ratio for current in the gradient-producing element versus current in the active shield element.

15. A method of suppressing eddy currents induced in components of a magnetic resonance imaging system by electromagnetic gradient-producing elements, the method comprising: disposing an active electromagnetic shield element about each of said gradient-producing elements in a magnetic resonance imaging system, and driving said active shield element with a currrent of opposite direction to minimize the external field of said gradient-producing element.

16. The method of claim 15 wherein each gradient-producing element is driven by an alternating current, and the active shield element is driven by an alternating current 180 degrees out of Phase.

17. The method of claim 15 wherein the method further comprises adjusting the ratio of the current in the gradient-producing element to the current in the active shield element until an optimal degree of eddy current suppression is obtained.

* * * * *